United States Patent
Bedell et al.

(10) Patent No.: US 9,536,736 B2
(45) Date of Patent: Jan. 3, 2017

(54) REDUCING SUBSTRATE BOWING CAUSED BY HIGH PERCENTAGE SIGE LAYERS

(71) Applicant: International Business Machines Corporation, Armonk, NY (US)

(72) Inventors: Stephen W. Bedell, Wappingers Falls, NY (US); Keith E. Fogel, Hopewell Junction, NY (US); Alexander Reznicek, Troy, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 31 days.

(21) Appl. No.: 14/613,419

(22) Filed: Feb. 4, 2015

(65) Prior Publication Data

US 2016/0225618 A1   Aug. 4, 2016

(51) Int. Cl.
| | | |
|---|---|---|
| H01L 29/207 | (2006.01) | |
| H01L 21/02 | (2006.01) | |
| H01L 21/324 | (2006.01) | |
| H01L 29/161 | (2006.01) | |
| H01L 29/167 | (2006.01) | |
| H01L 29/10 | (2006.01) | |

(52) U.S. Cl.
CPC ..... *H01L 21/02532* (2013.01); *H01L 21/0257* (2013.01); *H01L 21/0262* (2013.01); *H01L 21/02381* (2013.01); *H01L 21/324* (2013.01); *H01L 29/105* (2013.01); *H01L 29/1054* (2013.01); *H01L 29/161* (2013.01); *H01L 29/167* (2013.01)

(58) Field of Classification Search
CPC ............... H01L 21/02532; H01L 21/02381; H01L 21/0257; H01L 21/0262; H01L 21/324; H01L 29/105; H01L 29/1054; H01L 29/161; H01L 29/167
USPC ........................................................ 257/609
See application file for complete search history.

(56) References Cited

U.S. PATENT DOCUMENTS

| | | | |
|---|---|---|---|
| 7,560,326 B2 | 7/2009 | Mocuta et al. | |
| 7,700,467 B2 | 4/2010 | Bu et al. | |
| 7,947,546 B2 | 5/2011 | Liu et al. | |
| 8,652,892 B2 | 2/2014 | Liu et al. | |
| 2007/0257249 A1 | 11/2007 | Mocuta et al. | |
| 2008/0303060 A1 | 12/2008 | Han et al. | |
| 2009/0032841 A1 | 2/2009 | Eller et al. | |
| 2010/0012032 A1* | 1/2010 | Chen | C23C 16/505 118/715 |
| 2011/0223737 A1* | 9/2011 | Liu | H01L 21/823807 438/308 |
| 2012/0112208 A1* | 5/2012 | Adam | H01L 21/28525 257/77 |

\* cited by examiner

*Primary Examiner* — Tu-Tu Ho
(74) *Attorney, Agent, or Firm* — L. Jeffrey Kelly

(57) ABSTRACT

The present invention relates generally to semiconductor devices and more particularly, to a structure and method for reducing substrate bowing resulting from the formation of strained SiGe layers having a high percentage of germanium ("high concentration SiGe") on silicon substrates. During the epitaxial growth of the high concentration SiGe layer, carbon dopant atoms may be introduced to the crystalline lattice structure of the SiGe, forming a SiGe:C layer. The carbon dopant atoms may reduce tensile strain in the SiGe:C layer during annealing, thereby reducing substrate bowing.

19 Claims, 4 Drawing Sheets

REDUCING SUBSTRATE BOWING CAUSED BY HIGH PERCENTAGE SIGE LAYERS

BACKGROUND

The present invention relates generally to semiconductor devices, and more particularly, to a structure and method for reducing substrate bowing resulting from the formation of strained SiGe layers having a high percentage of germanium on silicon substrates.

In field effect transistor (FET) devices, the introduction of stress (i.e., compressive or tensile) to the channel region through high concentrations of germanium may be used in order to improve carrier mobility, which may subsequently increase device performance. The bandstructure of SiGe becomes more germanium-like as the concentration of germanium reaches 85% and above. Because of the increased carrier mobility at these bandstructures, 85% SiGe to pure germanium is a potential candidate to be used in the channels of devices having a 7 nm or lower node.

To work with current complementary metal oxide semiconductor (CMOS) technology, these high percentage SiGe or pure germanium layers may be formed on a silicon substrate. However, forming 85%-99% SiGe or pure germanium on silicon is very challenging due to the high lattice mismatch of 3.6% or more. The lattice mismatch between the SiGe and the silicon may cause defects in the SiGe layer such as dislocations and stacking faults. Typically, the SiGe layers may be grown very thick (5-10 microns or more) and may be graded in order to trap most of the defects at the interface. The defect-free upper portion of the SiGe layer may then be smart cut wafer bonded onto a silicon handle wafer to form a silicon germanium on insulator (SGOI) wafer.

SUMMARY

According to an embodiment, a method of reducing bowing of a substrate underlying a high concentration SiGe layer during annealing is disclosed. The method may include: forming a SiGe:C layer on the substrate, wherein the SiGe:C layer is doped with carbon atoms during epitaxial growth using a gaseous precursor, and wherein a concentration of the carbon atoms in the SiGe:C layer ranges from approximately $1 \times 10^{17}$ cm$^{-3}$ to approximately $5 \times 10^{19}$ cm-3.

According to another embodiment, a method is disclosed. The method may include: forming a SiGe:C layer on a substrate using an epitaxial growth process, wherein the SiGe:C layer is doped with carbon atoms during epitaxial growth using a gaseous precursor, and wherein a concentration of the carbon atoms in the SiGe:C layer ranges from approximately $1 \times 10^{17}$ cm$^3$ to approximately $5 \times 10^{19}$ cm-3; and annealing the SiGe:C layer and the substrate, wherein the carbon dopants in the SiGe:C layer reduce tensile strain development within the SiGe:C layer during the annealing process, thereby reducing bowing in the substrate.

According to another embodiment, a structure is disclosed. The structure may include: a substrate; and a SiGe:C layer on the substrate, wherein the SiGe:C layer comprises a silicon-germanium alloy with at least 85% germanium, and carbon dopants atoms in a concentration ranging from approximately $1 \times 10^{17}$ cm$^{-3}$ to approximately $5 \times 10^{19}$ cm-3.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
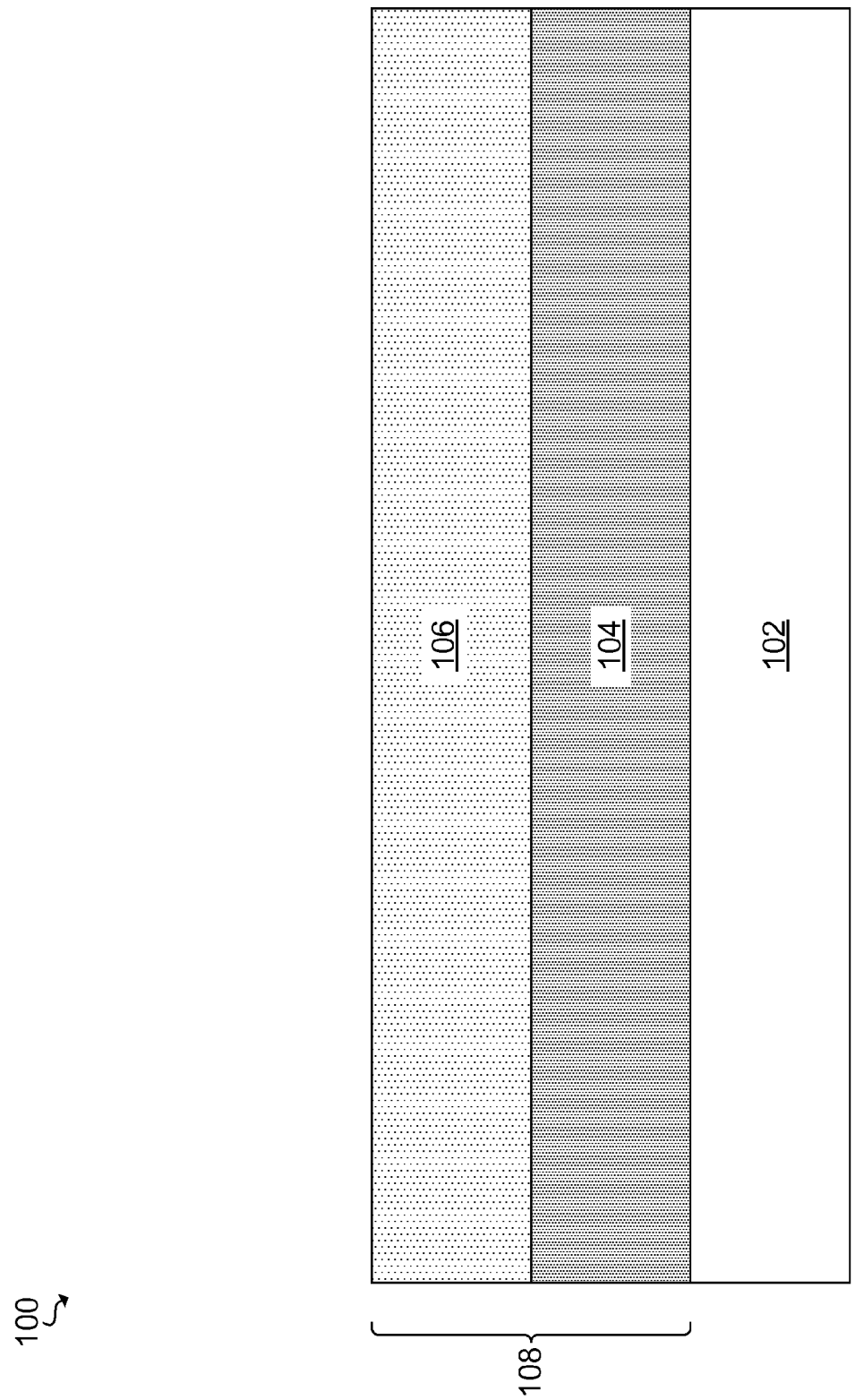
FIG. 1 is a cross section view illustrating forming a SiGe:C layer on a substrate, according an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The terms "epitaxial growth and/or deposition" and "epitaxially formed and/or grown" are used throughout the present application to denote the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. After the epitaxial material is deposited, additional layers, typically composed of an oxide, may be deposited on the epitaxial material to facilitate wafer bonding and an annealing process may be performed to set the additional layers. The temperature for the epitaxial deposition may range from approximately 400° C. to approximately 900° C. The temperature of the annealing process may range from approximately 500° C. to approximately 1500° C.

The present invention relates generally to semiconductor devices and more particularly, to a structure and method for reducing substrate bowing resulting from the formation of relaxed SiGe layers having a high percentage of germanium on silicon substrates. This "high concentration SiGe" may have a germanium concentration ranging from approximately 85% to approximately 99%. After the epitaxial growth of the high concentration SiGe layer, an annealing step may be performed. The high temperature of the anneal may cause the microstructure of the SiGe to change, introducing a tensile stress into the previously relaxed SiGe layer. This tensile stress may be significant enough to cause the underlying silicon substrate to bow and, if the SiGe layer is thick enough (i.e., more than 4 microns in the case of a 300 mm substrate), result in the substrate ultimately breaking.

The addition of carbon atoms to the high concentration SiGe layer has been shown to reduce the development of tensile strain during post-epitaxial annealing processes. Embodiments of the present invention may utilize carbon doping during the growth of a high concentration SiGe layer to form a SiGe:C layer that may reduce stress in a high mobility layer formed on a silicon substrate. In an embodiment, the SiGe:C layer may be in contact with the silicon substrate. In another embodiment, the SiGe:C layer may be an interlayer between undoped high concentration SiGe layers. The addition of carbon atoms may reduce the tensile strain within the SiGe:C layer itself and in adjacent undoped SiGe layers. The reduction in tensile strain may, in turn, reduce substrate bowing and breaking. Preferred techniques and structures may be described below with reference to FIGS. 1-4.

Referring now to FIG. 1, a cross section view of a structure 100 is shown. The structure 100 may include a substrate 102 with a high mobility layer 108, composed of one or more high concentration SiGe layers, formed thereon. The substrate 102 may be a bulk semiconductor substrate or a silicon on insulator (SOI) substrate. The substrate 102 may be made from any of several known semiconductor materials such as, for example, silicon, germanium, silicon-germanium alloy, carbon-doped silicon, carbon-doped silicon-germanium alloy, and compound (e.g. III-V and II-VI) semiconductor materials. Non-limiting examples of compound semiconductor materials include gallium arsenide, indium arsenide, and indium phosphide. In a preferred embodiment, the substrate 102 may be composed of silicon. The substrate 102 may be approximately, but is not limited to, several hundred microns thick. In an embodiment, the substrate 102 may have a thickness ranging from approximately 0.5 mm to approximately 1.5 mm. The substrate 102 may have a diameter of approximately 300 mm.

In an embodiment, a SiGe:C layer 104 may be formed directly on the substrate 102. A SiGe layer 106 may then be formed on the SiGe:C layer 104. The SiGe:C layer 104 may be composed of high concentration SiGe that has been doped with carbon atoms during formation. In an embodiment, the concentration of germanium in the SiGe:C layer 104 may be approximately 85%. The SiGe:C layer 104 may have a thickness ranging from approximately 500 nm to several micrometers. In an embodiment, the thickness of the SiGe:C layer 104 may be equal to or greater than 15 μm. The SiGe:C layer 104 may be formed using a conventional epitaxial growth process, during which the SiGe:C layer 104 may be doped with carbon using a gaseous carbon precursor. In an embodiment, the carbon precursor may be monomethylsilane (MMS). In a preferred embodiment, the carbon precursor may be monomethylgermane (MMG). The MMG precursor has no silicon atoms present in the molecule and therefore may not lower the concentration of germanium in the SiGe layer or add trace levels of silicon to layers of pure Ge.

The carbon precursor may be introduced during the epitaxial growth process in a carbon precursor containing gas mixture. In an embodiment, the carbon precursor containing gas may be composed of 5% carbon precursor in a dilutant gas, such as, for example, argon. In an embodiment, the carbon precursor may have a partial pressure of approximately 0.01 millitorr to approximately 1 millitorr in order to achieve low doping levels within the SiGe:C layer 104. In an embodiment, the carbon precursor containing gas may be introduced at a flow rate ranging from approximately 1 standard cubic centimeters per minute (SCCM) to approximately 20 SCCM, although lesser and greater values are considered. In an embodiment, the partial pressure of the carbon precursor may remain constant throughout the epitaxial growth process, resulting in a consistent concentration of carbon throughout the SiGe:C layer 104. In another embodiment, the partial pressure of the carbon precursor may be varied during the epitaxial growth process, resulting in a carbon concentration that is graded throughout the SiGe:C layer 104. In yet another embodiment, the partial pressure of the carbon precursor may be stopped during the epitaxial growth process, resulting in interlayers of carbon atoms throughout the SiGe:C layer 104 separated by undoped SiGe.

The doping levels of carbon atoms in the SiGe:C layer 104 may range from approximately $1\times10^{17}$ cm$^{-3}$ to approximately $5\times10^{19}$ cm$^{-3}$. In an embodiment, the carbon atoms may be incorporated into interstitial sites in the lattice of the SiGe:C layer 104, which have no influence on the strain state of the SiGe:C layer 104. Because of this location and the low overall carbon concentration, the strain level of the epitaxially grown SiGe:C layer 104 may remain relatively unchanged or may change only by a small amount.

The SiGe layer 106 may be formed on the SiGe:C layer 104. The SiGe layer 106 may be formed using a conventional epitaxial growth process. In an embodiment, the SiGe layer 106 may be formed during the same epitaxial growth process as the SiGe:C layer 104. The SiGe layer 106 may be composed of high concentration SiGe. The concentration of germanium in the SiGe layer 106 may be similar to the concentration of Ge in the SiGe:C layer 104. In an embodiment, the concentration of Ge in the SiGe layer 106 may be approximately 85%. The SiGe layer 106 may have a thickness ranging from approximately 500 nm to several micrometers. In an embodiment, the thickness of the SiGe layer 106 may be greater than 15 µm.

The presence of carbon may prohibit dislocations in the crystalline lattice of the SiGe layers from moving, thereby reducing stacking faults as well as preventing the dislocations from extending upward from the substrate interface and through the high mobility layer 108. After the formation of the SiGe:C layer 104, the structure 100 may be annealed by a conventional temperature annealing process as described above, without causing the bowing or breakage in the substrate 102 that may occur in non-doped samples.

Figure 2:
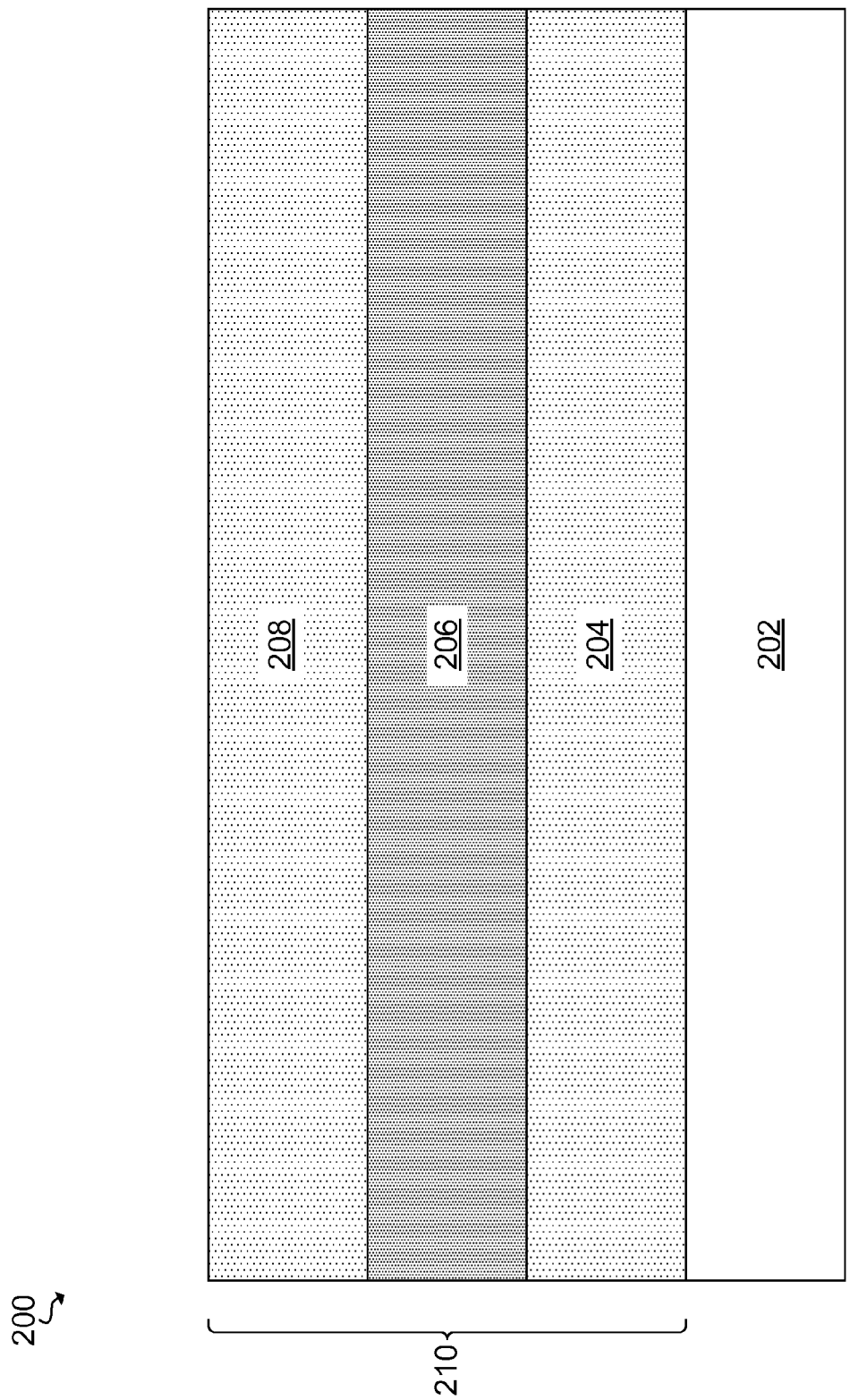
FIG. 2 is a cross section view illustrating forming a SiGe:C layer between high concentration SiGe layers, according an embodiment of the present invention.

Referring now to FIG. 2, and in another embodiment, a SiGe:C layer may be formed between high concentration SiGe layers to reduce the overall tensile strain. Structure 200 may include a substrate 202 with a high mobility layer 210 formed thereon. In an embodiment, a first SiGe layer 204 may be formed directly on the substrate 202. The substrate 202 may be a bulk semiconductor substrate. In such embodiments, the substrate 202 may be made from any of several known semiconductor materials such as, for example, silicon, germanium, silicon-germanium alloy, carbon-doped silicon, carbon-doped silicon-germanium alloy, and compound (e.g. III-V and II-VI) semiconductor materials. Non-limiting examples of compound semiconductor materials include gallium arsenide, indium arsenide, and indium phosphide. In a preferred embodiment, the substrate 202 may be composed of silicon. The substrate 202 may be approximately, but is not limited to, several hundred microns thick. In an embodiment, the substrate 202 may have a thickness ranging from approximately 0.5 mm to approximately 1.5 mm. The substrate 202 may have a diameter of approximately 300 mm.

The first SiGe layer 204 may be formed on the substrate 202 using a conventional epitaxial growth process. The first SiGe layer 204 may be composed of high concentration SiGe. In an embodiment, the concentration of Ge in the first SiGe layer 204 may be approximately 85%. The first SiGe layer 204 may have a thickness ranging from approximately 500 nm to several micrometers. In an embodiment, the thickness of the first SiGe layer 204 may be equal to or greater than 15 µm.

A SiGe:C layer 206 may be formed on the first SiGe layer 204. In an embodiment, the SiGe:C layer 206 may be formed during the same epitaxial growth process used to form the first SiGe layer 204. The SiGe:C layer 206 may be composed of high concentration SiGe that has been doped with carbon atoms during formation. The concentration of germanium in the SiGe:C layer 206 may be similar to the concentration of germanium in the first SiGe layer 204. In an embodiment, the concentration of germanium in the SiGe:C layer 206 may be approximately 85%. The SiGe:C layer 206 may have a thickness ranging from approximately 500 nm to several micrometers. In an embodiment, the thickness of the SiGe:C layer 206 may be equal to or greater than 15 µm. The SiGe:C layer 206 may be formed using a conventional epitaxial growth process, during which the SiGe:C layer 206 may be doped with carbon using a gaseous carbon precursor. In an embodiment, the carbon precursor may be monomethylsilane (MMS). In a preferred embodiment, the carbon precursor may be monomethylgermane (MMG). The MMG precursor has no silicon atoms present in the molecule and therefore may not lower the concentration of germanium in the SiGe layer or add trace levels of silicon to layers of pure Ge.

The carbon precursor may be introduced during the epitaxial growth process in a carbon precursor containing gas mixture. In an embodiment, the carbon precursor containing gas may be composed of 5% carbon precursor in a dilutant gas, such as, for example, argon. In an embodiment, the carbon precursor may have a partial pressure of approximately 0.01 to 1 millitorr in order to achieve low doping levels within the SiGe:C layer 206. In an embodiment, the carbon precursor containing gas may be introduced at a flow rate ranging from approximately 1 standard cubic centimeters per minute (SCCM) to approximately 20 SCCM, although lesser and greater values are considered. In an embodiment, the partial pressure of the carbon precursor may remain constant throughout the epitaxial growth process, resulting in a consistent concentration of carbon throughout the SiGe:C layer 206. In another embodiment, the partial pressure of the carbon precursor may be varied during the epitaxial growth process, resulting in a carbon concentration that is graded throughout the SiGe:C layer 206. In yet another embodiment, the partial pressure of the carbon precursor may be stopped during the epitaxial growth process, resulting in interlayers of carbon atoms throughout the SiGe:C layer 206 separated by undoped SiGe.

The doping levels of carbon atoms in the SiGe:C layer 206 may range from approximately $1 \times 10^{17}$ cm$^{-3}$ to approximately $5 \times 10^{19}$ cm$^{-3}$. In an embodiment, the carbon atoms may be incorporated into interstitial sites in the lattice of the SiGe:C layer 206, which have no influence on the strain state of the SiGe:C layer 206. Because of this location and the low overall carbon concentration, the strain level of the SiGe:C layer 206 may remain relatively unchanged or may change only by a small amount.

In an embodiment, a second SiGe layer 208 may be formed on the SiGe:C layer 206. The second SiGe layer 208 may be formed using a conventional epitaxial growth process. In an embodiment, the second SiGe layer 208 may be formed during the same epitaxial growth process as the SiGe:C layer 206. The second SiGe layer 208 may be composed of high concentration SiGe. The concentration of germanium in the second SiGe layer 208 may be similar to the concentration of germanium in the first SiGe layer 204. In an embodiment, the concentration of germanium in the second SiGe layer 208 may be approximately 85%. The second SiGe layer 208 may have a thickness ranging from approximately 500 nm to several micrometers. In an embodiment, the thickness of the second SiGe layer 208 may be equal to or greater than 15 µm. It should be noted that although only a second SiGe layer 208 is shown, embodiments are considered in which multiple SiGe layers may be formed on the SiGe:C layer 206.

The presence of carbon may prohibit dislocations in the crystalline lattice of the SiGe layers from moving, thereby reducing stacking faults as well as preventing the dislocations from extending throughout the high mobility layer 210. After the formation of the SiGe:C layer 206, the structure 200 may be annealed without causing the bowing or breakage in the substrate 202 that may occur in non-doped samples.

Figure 3:
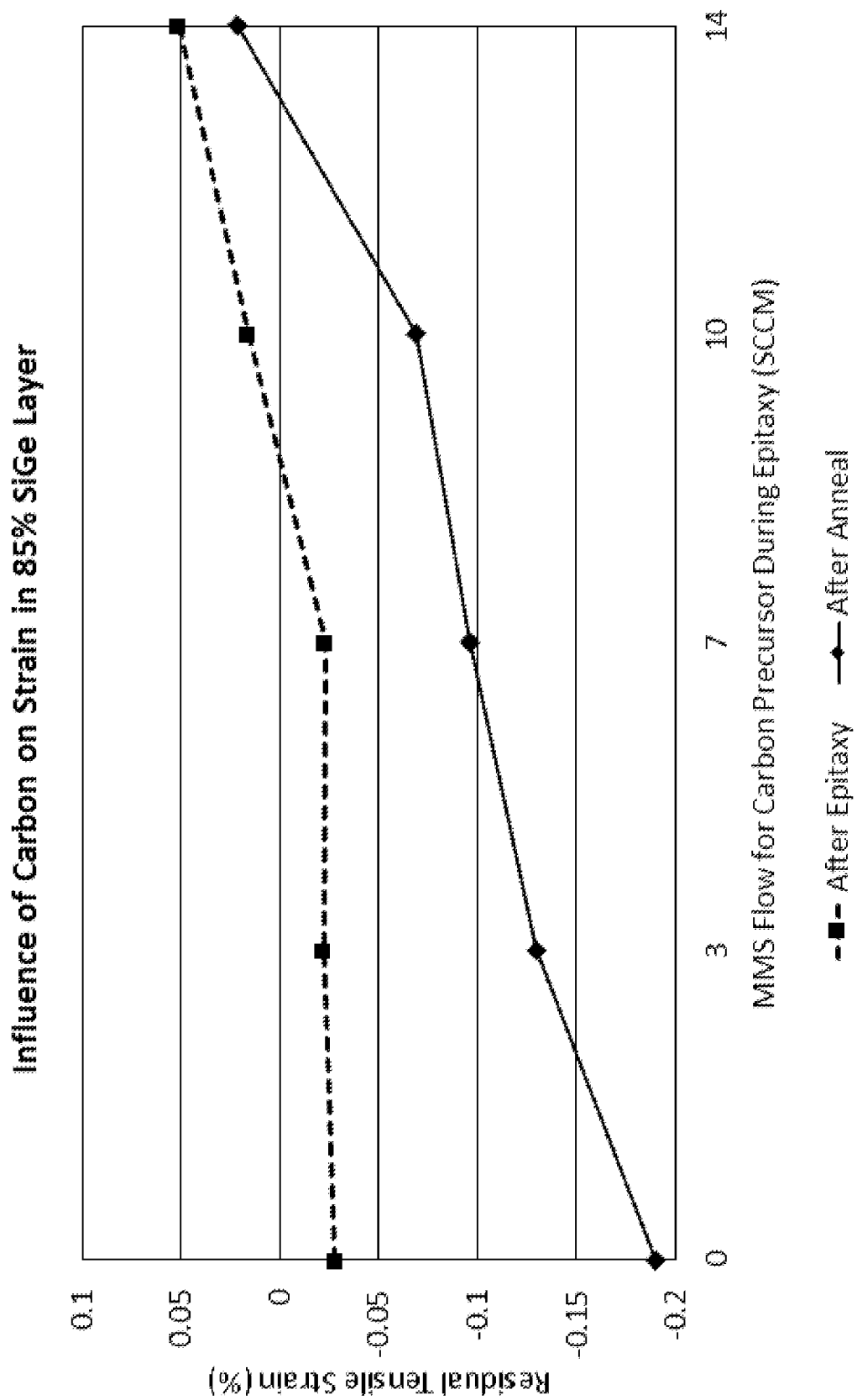
FIG. 3 is a chart illustrating the influence of carbon concentration on residual strain in a SiGe:C layer, according an embodiment of the present invention.

Referring now to FIG. 3, a chart showing the influence of carbon concentration on residual strain in a SiGe:C layer is shown. As an example, a SiGe:C layer having a germanium concentration of 85% and an overall thickness of 2 µm is used. It should be noted that thicker SiGe:C layers are contemplated. The SiGe:C layer may be formed on a silicon substrate. As the flow rate (SCCM) of the carbon containing precursor is increased during the epitaxial growth process of the SiGe:C layer, the concentration of carbon in the SiGe layer may be increased. As the concentration of carbon is increased, the residual tensile strain within the SiGe:C layer after annealing may be reduced. The measurements below were taken using high resolution X-ray diffraction reciprocal space maps. Table 1 below shows the amount of residual strain in the SiGe:C layer having a germanium concentration of 85% and an overall thickness of 2 μm after epitaxial growth, but before annealing. Table 2 below shows the amount of residual strain in the SiGe:C layer having a germanium concentration of 85% and an overall thickness of 2 μm after annealing at approximately 900° C. for approximately 60 min.

TABLE 1

Influence of Carbon on Residual Strain after Epitaxy

| Carbon Precursor Flow Rate During Epitaxy (SCCM) | Relaxation (%) | Residual Strain (%) |
|---|---|---|
| 0 | 100 | −0.028 |
| 3 | 100 | −0.022 |
| 7 | 100 | −0.023 |
| 10 | 99.5 | 0.016 |
| 14 | 98.5 | 0.051 |

TABLE 2

Influence of Carbon on Residual Strain after Anneal

| Carbon Precursor Flow Rate During Epitaxy (SCCM) | Relaxation (%) | Residual Strain (%) |
|---|---|---|
| 0 | 106 | −0.19 |
| 3 | 104 | −0.13 |
| 7 | 103 | −0.096 |
| 10 | 102 | −0.069 |
| 14 | 100.6 | 0.021 |

Figure 4:
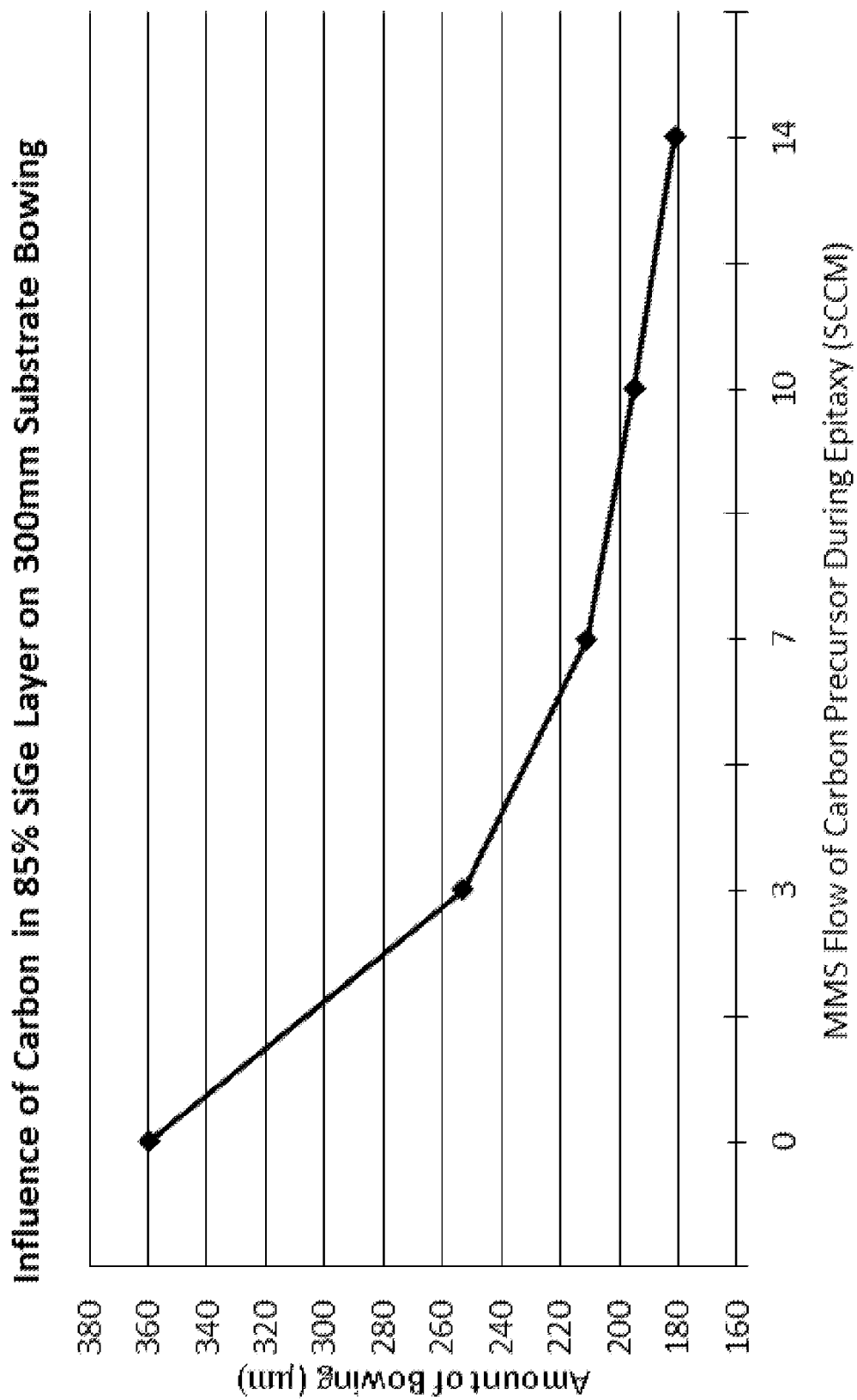
FIG. 4 is a chart illustrating the influence of carbon concentration in a SiGe:C layer on the amount of substrate bowing of an exemplary 300 mm silicon substrate, according an embodiment of the present invention.

Referring now to FIG. 4, a chart showing the influence of carbon concentration in a SiGe:C layer on the amount of substrate bowing is shown. As an example, a SiGe:C layer having a germanium concentration of 85% and an overall thickness of 2 μm is used. The SiGe:C layer may be formed on a silicon substrate. As the flow rate of carbon (SCCM) is increased during the epitaxial growth of the SiGe:C layer, and the concentration of carbon in the SiGe:C layer is increased. As the concentration of carbon in the SiGe:C layer is increased, the amount of wafer bowing (μm) may be decreased. Table 3 below shows the reduction in wafer bowing after annealing, using a 300 mm silicon wafer as substrate.

TABLE 3

Influence of Carbon on a 300 mm Substrate Bowing after Anneal

| Carbon Flow Rate During Epitaxy (SCCM) | Substrate Bowing (μm) |
|---|---|
| 0 | 360 |
| 3 | 253 |
| 7 | 211 |
| 10 | 195 |
| 14 | 181 |

Embodiments of the present invention may enable the formation of thicker high germanium concentration SiGe layers on silicon structures while reducing substrate bowing and breakage. The addition of carbon atoms into the crystalline lattice of the SiGe layer may enable the formation of fully relaxed high percentage SiGe on silicon that can be annealed and further processed with lower intrinsic stress than conventional SiGe layers. The use of SiGe:C layers may reduce tensile strain that may occur during annealing and, in turn, may reduce substrate and wafer bowing and breakage, especially in large diameter wafers (e.g., 300 mm and 450 mm).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of reducing bowing of a substrate underlying a high concentration SiGe layer during annealing comprising:
    forming a SiGe:C layer on the substrate, wherein the SiGe:C layer is doped with carbon atoms during epitaxial growth using a gaseous precursor, and wherein a concentration of the carbon atoms in the SiGe:C layer ranges from approximately $1\times10^{17}$ cm$^{-3}$ to approximately $5\times10^{19}$ cm$^{-3}$; and
    forming a high percentage SiGe layer on the SiGe:C layer.

2. The method of claim 1, wherein the SiGe:C layer comprises at least 85% germanium.

3. The method of claim 1, wherein the substrate comprises silicon.

4. The method of claim 1, wherein the gaseous precursor comprises monomethylsilane (MMS).

5. The method of claim 1, wherein the gaseous precursor comprises monomethylgermane (MMG).

6. The method of claim 1, further comprising forming a high percentage SiGe layer between the substrate and the SiGe:C layer.

7. The method of claim 1, wherein the gaseous precursor has a partial pressure of 0.01 to 1 millitorr.

8. A method comprising:
    forming a SiGe:C layer on a substrate using an epitaxial growth process, wherein the SiGe:C layer is doped with carbon atoms during epitaxial growth using a gaseous precursor, and wherein a concentration of the carbon atoms in the SiGe:C layer ranges from approximately $1\times10^{17}$ cm$^{-3}$ to approximately $5\times10^{19}$ cm$^{-3}$; and
    annealing the SiGe:C layer and the substrate, wherein the carbon dopants in the SiGe:C layer reduce tensile strain within the SiGe:C layer introduced during the annealing process, thereby reducing bowing in the substrate.

9. The method of claim 8, wherein the SiGe:C layer comprises at least 85% germanium.

10. The method of claim 8, wherein the substrate comprises silicon.

11. The method of claim 8, wherein the gaseous precursor comprises monomethylsilane (MMS).

12. The method of claim 8, wherein the gaseous precursor comprises monomethylgermane (MMG).

13. The method of claim 8, further comprising forming a high percentage SiGe layer on the SiGe:C layer.

14. The method of claim 8, further comprising forming a high percentage SiGe layer between the substrate and the SiGe:C layer.

15. The method of claim 8, wherein the gaseous precursor has a partial pressure of 0.01 to 1 millitorr.

16. A structure comprising:
a substrate; and
a SiGe:C layer on the substrate, wherein the SiGe:C layer comprises silicon, at least 85% germanium, and carbon dopants atoms in a concentration ranging from approximately $1\times10^{17}$ cm$^{-3}$ to approximately $5\times10^{19}$ cm$^{-3}$.

17. The structure of claim 16, further comprising a SiGe layer between the substrate and the SiGe:C layer, wherein the SiGe layer comprises silicon and at least 85% germanium.

18. The structure of claim 16, further comprising a SiGe layer on the SiGe:C layer, wherein the SiGe layer comprises silicon and at least 85% germanium.

19. The structure of claim 16, wherein the SiGe:C layer has a graded composition of carbon dopant atoms.

\* \* \* \* \*